(12) United States Patent
Lin

(10) Patent No.: US 11,489,542 B2
(45) Date of Patent: Nov. 1, 2022

(54) METHOD, DEVICE AND SYSTEM FOR DATA COMPRESSION AND DECOMPRESSION

(71) Applicant: Samsung Electronics Co., Ltd., Suwon-si (KR)

(72) Inventor: Qingchun Lin, Guangdong (CN)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/295,032

(22) PCT Filed: Nov. 20, 2018

(86) PCT No.: PCT/KR2018/014292
§ 371 (c)(1),
(2) Date: May 18, 2021

(87) PCT Pub. No.: WO2020/105746
PCT Pub. Date: May 28, 2020

(65) Prior Publication Data
US 2022/0014209 A1 Jan. 13, 2022

(51) Int. Cl.
*H03M 7/30* (2006.01)
(52) U.S. Cl.
CPC ....... *H03M 7/3059* (2013.01); *H03M 7/3073* (2013.01); *H03M 7/3088* (2013.01); *H03M 7/6047* (2013.01)
(58) Field of Classification Search
CPC .... H03M 7/30; H03M 7/3059; H03M 1/1215; H03M 7/6005; H03M 7/6011;
(Continued)

(56) References Cited

U.S. PATENT DOCUMENTS

| 7,009,533 B1* | 3/2006 | Wegener | H04N 1/413 341/87 |
| 11,277,800 B1* | 3/2022 | Marupaduga | H04W 80/02 |

(Continued)

FOREIGN PATENT DOCUMENTS

| CN | 104917533 A | 9/2015 |
| CN | 108768584 A | 11/2018 |

(Continued)

OTHER PUBLICATIONS

Tayq, "Fronthaul integration and monitoring in 5G networks", Oct. 9, 2018, 150 pages.

(Continued)

*Primary Examiner* — Linh V Nguyen

(57) ABSTRACT

A method, device, and system for data compression and decompression are provided. The method for data compression comprises, converting data to be transmitted within each period, from the time domain to the frequency domain, wherein, a default time length is set as a period; identifying weak power frequencies in the frequency domain data according to a set identification rule; weighting data transmitted on the identified weak power frequencies to obtain corresponding weighting information; converting other data converted to the frequency domain and the weighted data back to time domain; compressing the data converted back to the time domain; and transmitting, the compressed data along the weighting information.

12 Claims, 2 Drawing Sheets

--- data to be transmitted within each period is converted from the time domain to the frequency domain — 101 weak power frequencies in the frequency domain data are identified according to a set identification rule, data the identified weak power frequencies is weighted the data transmitted on the weak power frequencies is weighted to obtain corresponding weighting information — 102 other data converted to the frequency domain and the weighted data is converted back to time domain and then compressed, and the compressed data along with the weighting information is transmitted to a receiver — 103

(58) Field of Classification Search
CPC . H03M 7/6041; H03M 7/6094; H04L 1/0001; H04L 27/265; H04L 27/26524; H04L 1/0016; H04L 1/1819; H04L 1/203; H04L 27/06; H04L 27/26; H04L 27/2628; H04L 27/2634; H04L 27/2649; H04L 27/2651; H04L 5/003; H04L 5/1492; H04L 69/22; H04B 17/318; H04B 1/0007; H04B 1/28; H04B 10/118; H04B 15/00; H04B 7/0617; H04B 7/0628; H04B 7/0695; H04B 7/0697; H04B 7/088; H04B 7/18563; H04B 7/2643
USPC ..................................................... 341/76, 87
See application file for complete search history.

(56) References Cited

U.S. PATENT DOCUMENTS

| | | |
|---|---|---|
| 2004/0252852 A1 | 12/2004 | Taenzer |
| 2012/0014422 A1 | 1/2012 | Wegener |
| 2015/0365155 A1* | 12/2015 | Subramanian ....... H04B 7/0697 370/329 |
| 2016/0337047 A1* | 11/2016 | Khoshnevisan ...... H04W 16/32 |
| 2017/0302417 A1* | 10/2017 | Chun .................... H04L 5/0007 |
| 2018/0041327 A1* | 2/2018 | Wolff .................... H04L 5/1492 |
| 2018/0262206 A1 | 9/2018 | Yun et al. |
| 2019/0214029 A1* | 7/2019 | Lee ..................... G10L 19/0204 |

FOREIGN PATENT DOCUMENTS

| | | |
|---|---|---|
| EP | 3 065 324 A1 | 9/2016 |
| WO | 2014/183709 A1 | 11/2014 |

OTHER PUBLICATIONS

International Search Report dated Aug. 7, 2019 in connection with International Patent Application No. PCT/KR2018/014292, 3 pages.
Written Opinion of the International Searching Authority dated Aug. 7, 2019 in connection with International Patent Application No. PCT/KR2018/014292, 7 pages.

* cited by examiner

[Fig. 1]
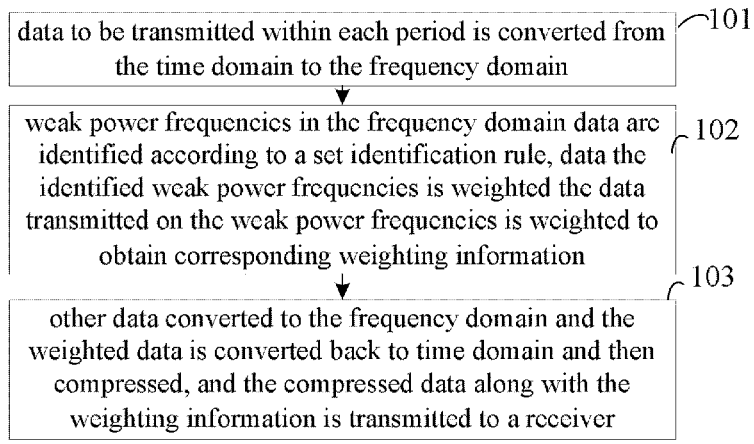
[Fig. 2]
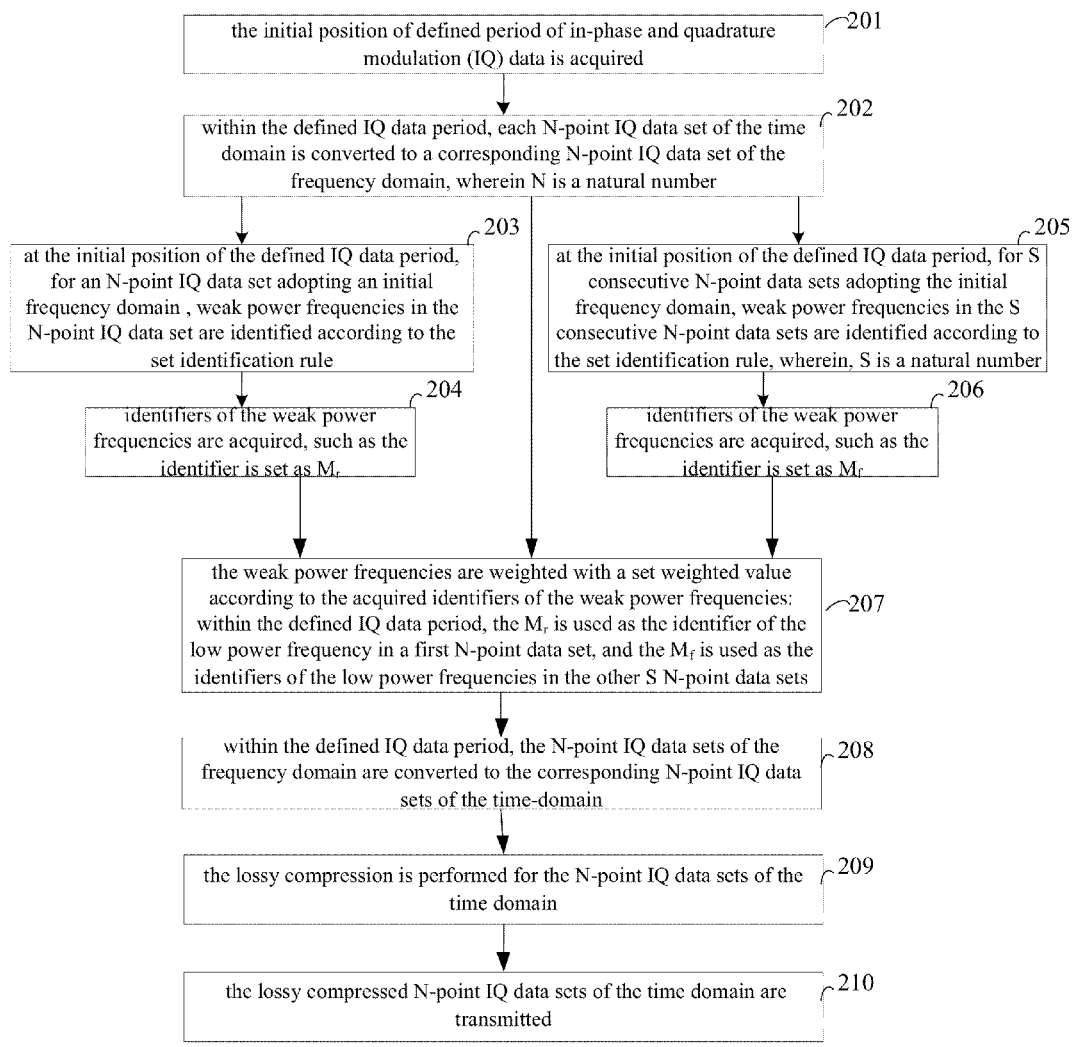

[Fig. 3]
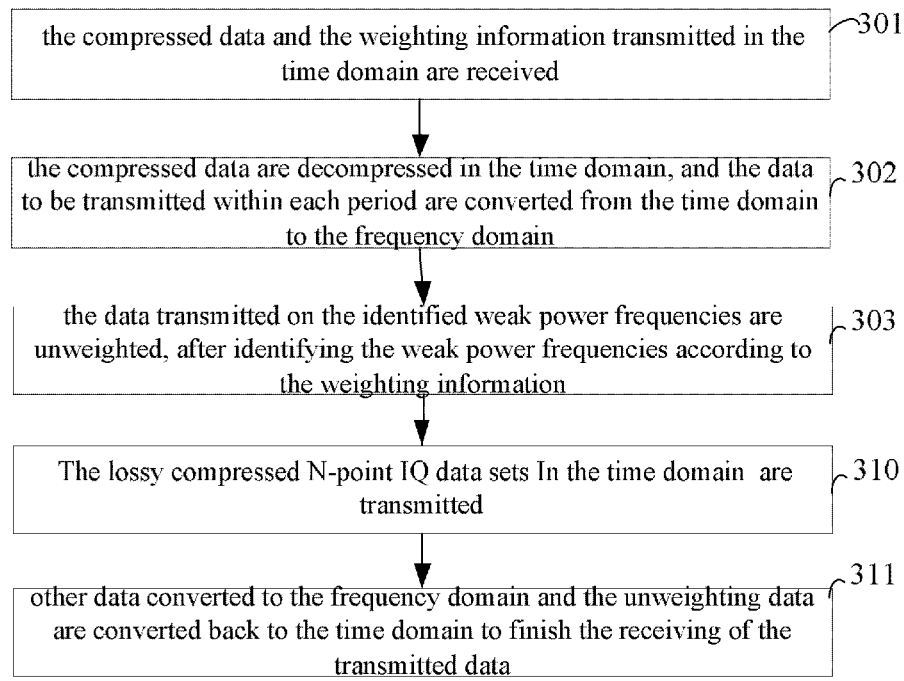
[Fig. 4]
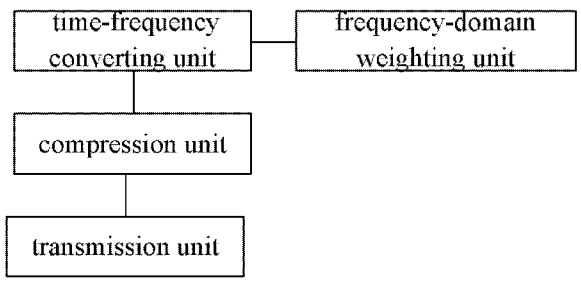
[Fig. 5]
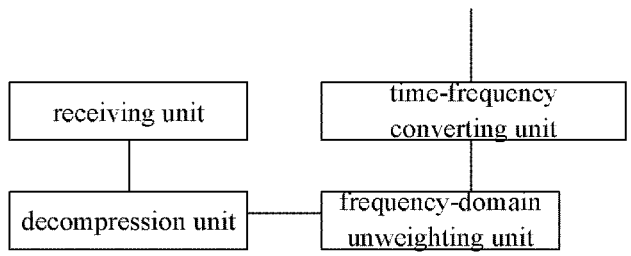
[Fig. 6]
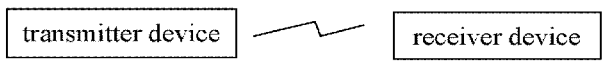

METHOD, DEVICE AND SYSTEM FOR DATA COMPRESSION AND DECOMPRESSION

CROSS-REFERENCE TO RELATED APPLICATION

This application is a 371 of International Application No. PCT/KR2018/014292 filed on Nov. 20, 2018, the disclosure of which is herein incorporated by reference in its entirety.

BACKGROUND

1. Field

The present disclosure relates to a data processing technology in the field of wireless communication, and more particularly relates to a method, device and system for data compression and decompression.

2. Description of Related Art

The modern wireless communication system adopts a common public radio interface (CPRI) protocol and transmits data by optical fibers. In the current high-speed and wide-broadband era, as increasing of the demand for data transmission in the wireless communication system, it is required to find a method to reduce the demand for high-speed optical fibers for data transmission, and the compression for transmitted data is an important method.

At present, the method for data compression in the wireless communication system is to carry out lossy compression on transmitted data simply. Specifically, the data to be transmitted are directly compressed in the time domain, and then the data compressed in the time domain are transmitted by the CPRI protocol, or the data are transformed to the frequency domain to be compressed, and the data compressed in the frequency domain are transmitted by the CPRI protocol. However, more serious signal noise ratio loss (SNR Loss) of the data transmitted by low power users will be caused by noises brought by using the compression manners above. Therefore, how to reduce the influence of the lossy compression on the data transmitted by low power users on the premise of ensuring an overall data compression ratio, overall mean square error (MSE) or error vector magnitude (EVM) during data transmission in wireless communication system becomes an urgently problem to be solved.

SUMMARY

The embodiments of the present disclosure are implemented as follows.

A method for data compression, comprising:
converting data to be transmitted within each period, from the time domain to the frequency domain, wherein, a default time length is set as a period;
identifying weak power frequencies in the frequency domain data according to a set identification rule;
weighting data transmitted on the identified weak power frequencies to obtain corresponding weighting information;
converting other data converted to the frequency domain and the weighted data back to the time domain;
compressing the data converted back to the time domain; and
transmitting the compressed data along with the weighting information.

The range of the weighting refers to a plurality of sampling points, a symbol, a time slot or a subframe.

The data transmission is through the CPRI protocol.

The identification rule is a rough identification rule, wherein, the rough identification rule comprises: power values of a plurality of consecutive frequency points of a set number are compared, the maximum power is set as a standard, the standard is minified to a set multiple to serve as a threshold, the power values of the multiple frequency points is compared with the threshold, and the frequencies with the power less than the threshold are taken as the weak power frequencies.

The identification rule is a fine identification rule, wherein, the fine identification rule comprises: a set number of consecutive multiple frequency points are set as a frequency point set, the consecutive multiple frequency points of the consecutive time domain are taken as multiple group frequency sets, the consecutive multiple group frequency sets are compared, the maximum power of each frequency of the consecutive multiple frequency points is acquired, the maximum of the maximum power of each frequency of the consecutive multiple frequency points is taken as a standard, the standard is minified to a set multiple to serve as a threshold, the threshold is compared with the frequency power of the subsequent frequency sets, and frequencies with the power less than the threshold in the subsequent frequency sets are taken as the weak power frequencies.

The weighting information is identifiers of the weak power frequencies.

The weighting information is transmitted through idle time-domain signal resources within the period, or transmitted through occupying time-domain signal resources for transmitting data within the period.

The method of claim 1 is re-executed within each period or within every other set period.

A method for data decompression, comprising:
receiving compressed data and weighting information transmitted in the time domain;
decompressing the compressed data in the time domain;
converting data to be transmitted within each period from the time domain to the frequency domain, wherein, a default time length is set as a period;
unweighting the data transmitted on the identified weak power frequencies, after identifying the weak power frequencies according to the weighting information; and
converting other data converted to the frequency domain and the unweighted data back to the time domain to finish receiving of the transmitted data.

The weighting information is identifiers of the weak power frequencies; and the unweighting is performed according to a set weighted value.

A device for data compression, comprising: a time-frequency converting unit, a frequency-domain weighting unit, a compression unit and a transmission unit, wherein,
the time-frequency converting unit, is to convert the data to be transmitted within each period from the time domain to the frequency domain, wherein, a default time length is set as a period; and convert other data converted to the frequency domain and the weighted data back to the time domain;
the frequency-domain weighting unit is to identify weak power frequencies in the frequency domain data according to a set identification rule, and weight the data transmitted on the identified weak power frequencies;
the compression unit is to compress the data converted back to the time domain; and the transmission unit is to transmit the compressed data along with the weighting information.

A device for data decompression, comprising: a receiving unit, a decompression unit, a time-frequency converting unit and a frequency-domain unweighting unit, wherein, the receiving unit is to receive compressed data and weighting information transmitted in the time domain;

the decompression unit is to decompress compressed data in the time domain;

the time-frequency converting unit is to convert the data to be transmitted within each period from the time domain to the frequency domain, wherein, a default time length is set as a period, and convert other data converted to the frequency domain and the unweighting data back to the time domain; and the frequency-domain unweighting unit is to unweight the data transmitted on the identified weak power frequencies, after identifying the weak power frequencies according to the weighting information.

A system for data compression and decompression, comprising transmitter device and receiver device, wherein, the transmitter device is to convert data to be transmitted within each period from the time domain to the frequency domain, wherein, a default time length is set as a period; identify weak power frequencies in the frequency domain data according to a set identification rule; weight data transmitted on the identified weak power frequencies to obtain corresponding weighting information; convert other data converted to the frequency domain and the weighted data back to the time domain; compress the data converted back to the time domain; and transmit the compressed data along with the weighting information to the receiver device; and the receiver device is to receive compressed data and weighting information transmitted in the time domain; decompress the compressed data in the time domain; convert data to be transmitted within each period from the time domain to the frequency domain, wherein, a default time length is set as a period; unweight the data transmitted on the identified weak power frequencies, after identifying the weak power frequencies according to the weighting information; and convert other data converted to the frequency domain and the unweighted data back to the time domain As mentioned above, according to embodiments of the present disclosure, data to be transmitted within each period is converted from the time domain to the frequency domain, wherein, a default time length is set as a period; weak power frequencies in the frequency domain data are identified according to a set identification rule; data transmitted on the identified weak power frequencies is weighted; other data converted to the frequency domain and the weighted data is converted back to the time domain; the data converted back to the time domain is compressed; and the compressed data along with the weighting information is transmitted to the receiver. At the receiver, compressed data and weighting information transmitted in the time domain is received; the compressed data in the time domain is decompressed; data to be transmitted within each period is converted from the time domain to the frequency domain, wherein, a default time length is set as a period; the data transmitted on the identified weak power frequencies is unweighted, after identifying the weak power frequencies according to the weighting information; and other data converted to the frequency domain and the unweighted data is converted back to the time domain. According to the methods devices and system provided by the embodiments of the present disclosure, the data transmitted on the weak power frequencies are weighted, so the loss in a lossy compression transmission process is low, receiver may receive data correctly, and the influence on compression ratio of the overall data will be small, and accordingly the influence of the lossy compression on the data transmitted by weak power users is reduced on the premise of ensuring the compression ratio of the overall data, overall MSE or EVM.

An embodiment of the present disclosure provides a method for data compression, which may reduce the influence of the lossy compression on the data transmitted by low power users on the premise of ensuring the compression ratio of the overall data, overall MSE or EVM.

An embodiment of the present disclosure provides a method for data decompression, which may reduce the influence of the lossy compression on the data transmitted by low power users on the premise of ensuring the compression ratio of the overall data, overall MSE or EVM.

An embodiment of the present disclosure provides a device for data compression, which may reduce the influence of the lossy compression on the data transmitted by low power users on the premise of ensuring the compression ratio of the overall data, overall MSE or EVM.

An embodiment of the present disclosure provides a device for data decompression, which may reduce the influence of the lossy compression on the data transmitted by low power users on the premise of ensuring the compression ratio of the overall data, overall MSE or EVM.

An embodiment of the present disclosure provides a system for data compression and decompression, which may reduce the influence of the lossy compression on the data transmitted by low power users on the premise of ensuring the compression ratio of the overall data, overall MSE or EVM.

BRIEF DESCRIPTION OF THE DRAWINGS

FIG. 1 is a flow diagram illustrating a method for data compression according to various embodiments of the present disclosure;

FIG. 2 is a flow diagram illustrating a method for data compression according to various embodiments of the present disclosure;

FIG. 3 is a flow diagram of a method for data decompression according to various embodiments of the present disclosure;

FIG. 4 is a schematic diagram illustrating structure of a device for data compression according to various embodiments of the present disclosure;

FIG. 5 is a schematic diagram illustrating structure of a device for data decompression according to various embodiments of the present disclosure;

FIG. 6 is a schematic diagram illustrating structure of a system for data compression and decompression according to various embodiments of the present disclosure.

DETAILED DESCRIPTION

In order to make the purpose, technical scheme and advantages of the present disclosure clearer, some embodiments of the present disclosure will be described in detail below with reference to the accompanying drawings.

On the premise of ensuring the compression ratio of the overall data, overall MSE or EVM, the influence of the lossy compression on the data transmitted by weak power users is reduced by the embodiments of the present disclosure. According to the embodiments of the present disclosure, data to be transmitted within each period from the time domain is converted to the frequency domain, wherein, a default time length is set as a period; weak power frequencies in the frequency domain data are identified according to a set identification rule; data transmitted on the identified weak power frequencies is weighted; other data converted to the frequency domain and the weighted data is converted back to the time domain; the data converted back to the time domain is compressed; and the compressed data along with the weighting information is transmitted to the receiver. At the receiver, compressed data and weighting information transmitted in the time domain is received; the compressed data in the time domain is decompressed; data to be transmitted within each period is converted from the time domain to the frequency domain, wherein, a default time length is set as a period; the data transmitted on the identified weak power frequencies is unweighted, after identifying the weak power frequencies according to the weighting information; and other data converted to the frequency domain and the unweighted data is converted back to the time domain Therefore, according to the method, devices and system provided by the embodiments of the present disclosure, the data transmitted on the weak power frequencies are weighted, so the loss in the lossy compression transmission process is low, the receiver may receive data correctly, and great influence on the compression ratio of the overall data is avoided.

FIG. 1 is a flow diagram illustrating a method for data compression according to various embodiments of the present disclosure, which includes the specific steps below:

Step 101: data to be transmitted within each period is converted from the time domain to the frequency domain wherein, a default time length is set as a period; Step 102: weak power frequencies in the frequency domain data are identified according to a set identification rule, data the identified weak power frequencies is weighted the data transmitted on the weak power frequencies is weighted to obtain corresponding weighting information Step 103: other data converted to the frequency domain and the weighted data is converted back to time domain and then compressed, and the compressed data along with the weighting information is transmitted to a receiver. In the method, the range of the weighting refers to a plurality of sampling points, a symbol, a time slot or a subframe and the like.

In the method, various compression algorithms can be employed in the compression of the time domain, a lossy compression algorithm is employed generally.

In the method, data transmission is based on the CPRI protocol.

In the method, the identification rule may be a rough identification rule or a fine identification rule.

According to an example of the present disclosure, the rough identification rule may include: power values of consecutive multiple frequency points of set number is compared, the maximum power is set as a standard, the standard is minified to a set multiple to serve as a threshold, the power values of the multiple frequency points is compared with the threshold, and the frequencies with the power less than the threshold are taken as the weak power frequencies.

And the fine identification rule may include: a set number of consecutive multiple frequency points are set as a frequency point set, the consecutive multiple frequency points of the consecutive time domain are taken as multiple group frequency sets, the consecutive multiple group frequency sets are compared, the maximum power of each frequency of the consecutive multiple frequency points is acquired, the maximum of the maximum power of each frequency of the consecutive multiple frequency points are taken as a standard, the standard is minified to a set multiple serving as a threshold, the threshold is compared with the frequency power of the subsequent frequency sets frequencies, and frequencies with the power less than the threshold in the subsequent frequency sets are taken as the weak power frequencies.

In the method, a weighted value adopted by the weighting may be set according to actual requirements to increase transmitting power of the data transmitted on the weak power frequencies.

In the method, the weighting information is transmitted, which identifies the weak power frequencies. The weighting information may be transmitted through the idle time-domain signal resources within the period, or may be transmitted through occupying the time-domain signal resources for transmitting data within the period.

In the method, the method of FIG. 1 is re-executed within each period or within every other set period.

A specific embodiment will be described in detail below.

As shown in FIG. 2, FIG. 2 is a flow diagram illustrating a method for data compression according to the embodiment of the present disclosure, which comprises the following specific steps.

Step 201: the initial position of defined period of in-phase and quadrature modulation (IQ) data is acquired.

In the present step, the IQ data is the data to be transmitted, and the set period may be a subframe, a time slot or a symbol in a long term evolution (LTE) system.

The step is to acquire the data to be transmitted in a period.

Step 202: within the defined IQ data period, each N-point IQ data set of the time domain is converted to a corresponding N-point IQ data set of the frequency domain, wherein N is a natural number, then Step 203, Step 205 and Step 207 are executed.

In Step 203-204, identification is implemented through a rough identification rule, in Step 205-206, identification is implemented through a fine identification rule.

Step 203: at the initial position of the defined IQ data period, for an N-point IQ data set adopting an initial frequency domain, weak power frequencies in the N-point IQ data set are identified according to the set identification rule.

Specifically, in the N-point IQ data set adopting the initial frequency domain, the maximum power is taken as a standard, the standard is minified to the set multiple to serve as a threshold, the power of the frequencies in the N-point IQ data set are compared with the threshold, and frequencies with the power less than the threshold in the N-point IQ data set are taken as the weak power frequencies.

Step 204: identifiers of the weak power frequencies are acquired, such as the identifier is set as $M_r$, and Step 207 is executed.

Step 205: at the initial position of the defined IQ data period, for S consecutive N-point data sets adopting the initial frequency domain, weak power frequencies in the S consecutive N-point data sets are identified according to the set identification rule, wherein, S is a natural number.

specifically, the S consecutive N-point data sets are compared, after acquiring a maximum power of each frequency of N points in the N-point data sets, the maximum of the maximum power of each frequency of the N points is taken as a standard, the standard is minified to a set multiple to serve as a threshold, the power of the frequencies in a N-point IQ data set after S consecutive N-point IQ data sets are compared with the threshold, and frequencies with the power less than the threshold in the subsequent frequency sets are taken as the weak power frequencies.

Step 206: identifiers of the weak power frequencies are acquired, such as the identifier is set as $M_f$, Step 207 is executed.

Step 207: the weak power frequencies are weighted with a set weighted value according to the acquired identifiers of the weak power frequencies: within the defined IQ data period, the $M_r$ is used as the identifier of the low power frequency in a first N-point data set, and the $M_f$ is used as the identifiers of the low power frequencies in the other S N-point data sets.

Step 208: within the defined IQ data period, the N-point IQ data sets of the frequency domain are converted to the corresponding N-point IQ data sets of the time-domain.

Step 209: the lossy compression is performed for the N-point IQ data sets of the time domain.

Step 210: the lossy compressed N-point IQ data sets of the time domain are transmitted.

FIG. 3 is a flow diagram illustrating a method for data decompression provided by an embodiment of the present disclosure, which comprises the following specific steps.

Step 301: the compressed data and the weighting information transmitted in the time domain are received.

Step 302: the compressed data are decompressed in the time domain, and the data to be transmitted within each period are converted from the time domain to the frequency domain, wherein, a default time length is set as a period.

Step 303: the data transmitted on the identified weak power frequencies are unweighted, after identifying the weak power frequencies according to the weighting information. Step 310: The lossy compressed N-point IQ data sets in the time domain are transmitted.

Step 311: other data converted to the frequency domain and the unweighting data are converted back to the time domain to finish the receiving of the transmitted data.

In the present method, the weighting information is the identifier of the weak power frequencies.

And the unweighting is performed according to the set weighted value.

In an embodiment of the present disclosure, a device for compressing the transmitted data may be a base station or a relay server of a cell used for jurisdictional user. It is not limited to the device here. As shown in FIG. 4, FIG. 4 is a schematic diagram illustrating a structure of a device for data compression provided by an embodiment of the present disclosure, which comprises a time-frequency converting unit, a frequency-domain weighting unit, a compression unit and a transmission unit.

According to examples of the present disclosure, the time-frequency converting unit is to convert the data to be transmitted within each period from the time domain to the frequency domain, wherein, a default time length is set as a period; and convert other data converted to the frequency domain and the weighted data back to the time domain.

The frequency-domain weighting unit is to weight the data transmitted on the identified weak power frequencies after identifying the weak power frequencies in the frequency domain data according to a set identification rule.

The compression unit is to compress the data converted back to the time domain.

And the transmission unit is to transmit the compressed data along with the weighting information.

In an embodiment of the present disclosure, a device for decompressing the transmitted data may be various servers in wireless communication network sides. It is not limited to the device here. As shown in FIG. 5, FIG. 5 is a schematic diagram illustrating a structure of a device for data decompression provided by an embodiment of the present disclosure, which comprises a receiving unit, a decompression unit, a time-frequency converting unit and a frequency-domain unweighting unit.

According to examples of the present disclosure, the receiving unit is to receive compressed data and weighting information transmitted in the time domain.

The decompression unit is to decompress compressed data in the time-domain.

The time-frequency converting unit is to convert the data to be transmitted within each period from the time domain to the frequency domain, wherein, a default time length is set as a period; and convert other data converted to the frequency domain and the unweighting data back to the time domain.

And the frequency-domain unweighting unit is to identify weak power frequencies according to the weighting information, and unweight the data transmitted on the identified weak power frequencies.

FIG. 6 is a schematic diagram illustrating a structure of a system for data compression and decompression provided by an embodiment of the present disclosure, which specifically comprises transmitter device and receiver device.

According to examples of the present disclosure, the transmitter device is to convert data to be transmitted within each period from the time domain to the frequency domain, wherein, a default time length is set as a period; identify weak power frequencies in the frequency domain data according to a set identification rule; weight data transmitted on the identified weak power frequencies to obtain corresponding weighting information; convert other data converted to the frequency domain and the weighted data back to the time domain; compress the data converted back to the time domain; and transmit the compressed data along with the weighting information to the receiver device.

And the receiver device is to receive compressed data and weighting information transmitted in the time domain; decompress the compressed data in the time domain; convert data to be transmitted within each period from the time domain to the frequency domain, wherein, a default time length is set as a period; unweight the data transmitted on the identified weak power frequencies, after identifying the weak power frequencies according to the weighting information; and convert other data converted to the frequency domain and the unweighted data back to the time domain.

In the system, the transmitter device may be a base station or a relay server of a cell used for jurisdictional user, it is not limited to the device here; and the receiver device may be various servers in wireless communication network sides, it is not limited to the device here.

In the system, the data is transmitted between the transmitter device and the receiver device through the CPRI protocol.

From the technical solutions provided by the embodiments of the present disclosure, it can be observed that for uplink data, particularly uplink IQ data in the wireless communication system, the signal noise ratio loss of the data transmitted on the weak power frequencies may be obviously reduced on the premise of ensuring the compression ratio of the overall data, overall MSE or EVM through the technical solutions provided by the embodiments of the present disclosure.

The foregoing embodiments are only preferable embodiments of the present disclosure and are not for limiting the present disclosure. Any modifications, equivalent substitutions, improvements and the like in accordance with the spirit and principles of the present disclosure should fall within the protection scope of the present disclosure.

The invention claimed is:

1. A method for data compression, the method comprising:
converting data to be transmitted within each period, from a time domain to a frequency domain, wherein, a default time length is set as a period;
identifying weak power frequencies in frequency domain data according to a set identification rule;
weighting data transmitted on the identified weak power frequencies to obtain corresponding weighting information;
converting other data converted to the frequency domain and the weighted data back to the time domain;
compressing the data converted back to the time domain; and
transmitting the compressed data along the weighting information.

2. The method according to claim 1, wherein, a range of the weighting refers to a plurality of sampling points, a symbol, a time slot, or a subframe.

3. The method according to claim 1, wherein, data are transmitted through a CPRI protocol.

4. The method according to claim 1, wherein, the identification rule is a rough identification rule, the rough identification rule comprising:
comparing power values of a plurality of consecutive frequency points of a set number;
setting a maximum power as a standard;
minifying the standard to a set times to serve as a threshold;
comparing the power values of the consecutive frequency points with the threshold; and
taking frequencies with a power less than the threshold as the weak power frequencies.

5. The method according to claim 1, wherein, the identification rule is a fine identification rule, the fine identification rule comprising:
setting a set number of consecutive frequency points as a frequency point set;
taking the consecutive frequency points of consecutive time domain as a plurality of group frequency sets;
comparing the plurality of group frequency sets;
acquiring a maximum power of each frequency of the consecutive frequency points;
taking a maximum of the maximum power of each frequency of the consecutive frequency points as a standard;
minifying the standard to a set times to serve as a threshold;
comparing the threshold with a frequency power of subsequent frequency sets; and
taking frequencies with a power less than the threshold in the subsequent frequency sets as the weak power frequencies.

6. The method according to claim 1, wherein, the weighting information is identifiers of low power frequencies; and wherein, the weighting information is transmitted through idle time-domain signal resources within the period, or transmitted through occupying time-domain signal resources for transmitting data within the period.

7. The method according to claim 1, wherein, the method according to claim 1 is re-executed within each period or within every other set period.

8. A method for data decompression, the method comprising:
receiving compressed data and weighting information transmitted in a time domain;
decompressing the compressed data in the time domain;
converting data to be transmitted within each period, from the time domain to a frequency domain, wherein, a default time length is set as a period;
unweighting data transmitted on identified weak power frequencies, after identifying the weak power frequencies according to the weighting information; and
converting other data converted to the frequency domain and the unweighting data back to the time domain to finish receiving of the transmitted data.

9. The method according to claim 8, wherein, the weighting information is identifiers of the weak power frequencies; and the unweighting is performed according to a set weighted value.

10. A device for data compression, the device comprising: a time-frequency converting unit, a frequency-domain weighting unit, a compression unit and a transmission unit, wherein,
the time-frequency converting unit is configured to: convert data to be transmitted within each period from a time domain to the frequency domain, wherein, a default time length is set as a period; and convert other data converted to the frequency domain and weighted data back to the time domain;
the frequency-domain weighting unit is configured to weight data transmitted on identified weak power frequencies after identifying the weak power frequencies in the frequency domain data according to a set identification rule;
the compression unit is configured to compress the data converted back to the time domain; and
the transmission unit is configured to transmit the compressed data along with weighting information.

11. A device for data decompression, the device comprising: a receiving unit, a decompression unit, a time-frequency converting unit and a frequency-domain unweighting unit, wherein,
the receiving unit is configured to receive compressed data and weighting information transmitted in a time domain;
the decompression unit is configured to decompress the compressed data in the time domain;
the time-frequency converting unit is configured to: convert data to be transmitted within each period from the time domain to a frequency domain, wherein, a default time length is set as a period; and convert other data converted to the frequency domain and unweighting data back to the time domain; and
the frequency-domain unweighting unit is configured to unweight data transmitted on identified weak power frequencies, after identifying the weak power frequencies according to the weighting information.

12. A system for data compression and decompression, the system comprising: a transmitter device and receiver device, wherein,
the transmitter device is configured to: convert data to be transmitted within each period from a time domain to a frequency domain, wherein, a default time length is set as a period; identify weak power frequencies in frequency domain data according to a set identification rule; weight data transmitted on the identified weak power frequencies to obtain corresponding weighting information; convert other data converted to the frequency domain and the weighted data back to the time domain; and compress the data converted back to the time domain; and transmit the compressed data along with the weighting information to the receiver device; and the receiver device is configured to: receive compressed data and weighting information transmitted in the time domain; decompress the compressed data in the time domain; convert data to be transmitted within each period from the time domain to the frequency domain, wherein, a default time length is set as a period; unweight the data transmitted on the identified weak power frequencies, after identifying the weak power frequencies according to the weighting information; and convert other data converted to the frequency domain and the unweighted data back to the time domain.

* * * * *